(12) United States Patent
Venk et al.

(10) Patent No.: US 10,368,436 B2
(45) Date of Patent: Jul. 30, 2019

(54) CONDUCTOR PAD FOR FLEXIBLE CIRCUITS AND FLEXIBLE CIRCUIT INCORPORATING THE SAME

(71) Applicants: Sridharan Venk, Treviso (IT); Earl Alfred Picard, Jr., Portsmouth, NH (US); Qi Dai, Shanghai (CN); Richard Garner, Arlington, MA (US)

(72) Inventors: Sridharan Venk, Treviso (IT); Earl Alfred Picard, Jr., Portsmouth, NH (US); Qi Dai, Shanghai (CN); Richard Garner, Arlington, MA (US)

(73) Assignee: OSRAM SYLVANIA Inc., Wilmington, MA (US)

( * ) Notice: Subject to any disclaimer, the term of this patent is extended or adjusted under 35 U.S.C. 154(b) by 0 days.

(21) Appl. No.: 15/459,740

(22) Filed: Mar. 15, 2017

(65) Prior Publication Data

US 2017/0188454 A1     Jun. 29, 2017

Related U.S. Application Data

(63) Continuation of application No. 14/292,829, filed on May 31, 2014, now Pat. No. 9,635,759.

(Continued)

(51) Int. Cl.
*F21S 4/22*     (2016.01)
*H05K 1/02*     (2006.01)
(Continued)

(52) U.S. Cl.
CPC ............... *H05K 1/111* (2013.01); *F21S 4/22* (2016.01); *F21V 21/005* (2013.01); *H01L 24/97* (2013.01);
(Continued)

(58) Field of Classification Search
CPC ... H05K 1/11; H05K 3/30; H05K 1/02; H05K 1/111; H05K 1/028; H05K 2201/10522
(Continued)

(56) References Cited

U.S. PATENT DOCUMENTS 7,098,408 B1 *   8/2006   Camerlo ............... H05K 1/111
                                                     174/260
7,439,449 B1 *   10/2008   Kumar ................. G02B 6/4292
                                                     174/254
(Continued)

FOREIGN PATENT DOCUMENTS

EP          0 893 946 A2     1/1999

OTHER PUBLICATIONS

Derek Kelly, International Search Report and Written Opinion of the International Searching Authority for PCT/US14/50653, dated Nov. 19, 2014, pp. 1-13, European Patent Office, Rijswijk, The Netherlands.

*Primary Examiner* — Michael P McFadden
(74) *Attorney, Agent, or Firm* — Shaun P. Montana

(57) ABSTRACT

A conductor pad and a flexible circuit including a conductor pad are provided. The conductor pad includes a first contact region, a second contact region, and a body portion configured to establish a conductive path between the first contact region and the second contact region. The body portion includes a perimeter edge having at least a first convex segment and a second convex with a first non-convex segment disposed between the first convex segment and the second convex segment. A method of constructing a flexible circuit to facilitate roll-to-roll manufacturing of the flexible circuit is also provided.

10 Claims, 8 Drawing Sheets

Related U.S. Application Data

(60) Provisional application No. 61/866,683, filed on Aug. 16, 2013, provisional application No. 61/971,914, filed on Mar. 28, 2014.

(51) Int. Cl.

| | | |
|---|---|---|
| *H05K 1/11* | (2006.01) | |
| *H05K 1/18* | (2006.01) | |
| *H05K 3/00* | (2006.01) | |
| *H05K 3/02* | (2006.01) | |
| *H05K 3/28* | (2006.01) | |
| *H05K 3/30* | (2006.01) | |
| *H01L 23/00* | (2006.01) | |
| *H01L 33/38* | (2010.01) | |
| *H01L 33/44* | (2010.01) | |
| *H01L 33/62* | (2010.01) | |
| *F21V 21/005* | (2006.01) | |
| *G06K 19/077* | (2006.01) | |

(52) U.S. Cl.
CPC ........... *H01L 33/385* (2013.01); *H05K 1/028* (2013.01); *H05K 1/0296* (2013.01); *H05K 1/118* (2013.01); *H05K 3/30* (2013.01); *G06K 19/07749* (2013.01); *H01L 24/29* (2013.01); *H01L 24/32* (2013.01); *H01L 24/48* (2013.01); *H01L 24/83* (2013.01); *H01L 24/85* (2013.01); *H01L 33/44* (2013.01); *H01L 33/62* (2013.01); *H01L 2224/291* (2013.01); *H01L 2224/2919* (2013.01); *H01L 2224/32227* (2013.01); *H01L 2224/48227* (2013.01); *H01L 2224/8385* (2013.01); *H01L 2224/83424* (2013.01); *H01L 2224/83439* (2013.01); *H01L 2224/83444* (2013.01); *H01L 2224/83447* (2013.01); *H01L 2224/83801* (2013.01); *H01L 2224/85424* (2013.01); *H01L 2224/85439* (2013.01); *H01L 2224/85444* (2013.01); *H01L 2224/85447* (2013.01); *H01L 2224/97* (2013.01); *H01L 2924/00014* (2013.01); *H01L 2924/12041* (2013.01); *H01L 2924/12043* (2013.01); *H01L 2924/12044* (2013.01); *H01L 2924/1421* (2013.01); *H05K 1/0209* (2013.01); *H05K 1/189* (2013.01); *H05K 3/0097* (2013.01); *H05K 3/02* (2013.01); *H05K 3/28* (2013.01); *H05K 2201/051* (2013.01); *H05K 2201/099* (2013.01); *H05K 2201/09381* (2013.01); *H05K 2201/09445* (2013.01); *H05K 2201/09727* (2013.01); *H05K 2201/09736* (2013.01); *H05K 2201/09872* (2013.01); *H05K 2201/10098* (2013.01); *H05K 2201/10106* (2013.01); *H05K 2201/10522* (2013.01); *H05K 2203/1545* (2013.01); *Y02P 70/611* (2015.11); *Y10T 29/4913* (2015.01)

(58) Field of Classification Search
USPC ............... 361/749, 750, 753, 771, 773, 774; 174/254, 255, 256, 260, 261
See application file for complete search history.

(56) References Cited

U.S. PATENT DOCUMENTS

| | | | |
|---|---|---|---|
| RE43,017 E | | 12/2011 | Belliveau |
| 8,567,992 B2* | | 10/2013 | Lo ...................... H05B 33/0803 |
| | | | 315/312 |
| 2005/0104059 A1* | | 5/2005 | Friedman ........... A61M 25/1011 |
| | | | 257/40 |
| 2014/0218954 A1* | | 8/2014 | Yoon ....................... H01L 33/62 |
| | | | 362/546 |

\* cited by examiner

CONDUCTOR PAD FOR FLEXIBLE CIRCUITS AND FLEXIBLE CIRCUIT INCORPORATING THE SAME

CROSS-REFERENCE TO RELATED APPLICATIONS

The present application is a continuation of, and claims the priority benefit of, U.S. patent application Ser. No. 14/292,892, entitled "CONDUCTOR PAD FOR FLEXIBLE CIRCUITS AND FLEXIBLE CIRCUITS INCORPORATING THE SAME" and filed May 31, 2014, now U.S. Pat. No. 9,635,759, which claims priority of U.S. Provisional Patent Application No. 61/866,683, entitled "CONDUCTOR PADS FOR THERMAL DISSIPATION" and filed Aug. 16, 2013, and of U.S. Provisional Patent Application No. 61/971,914, entitled "CONDUCTOR PAD FOR FLEXIBLE CIRCUITS AND FLEXIBLE CIRCUIT INCORPORATING THE SAME" and filed Mar. 28, 2014, the entire contents of all of which are hereby incorporated by reference.

TECHNICAL FIELD

The present application relates to electrical circuits, and more particularly, to a conductor pad for a flexible electrical circuit and flexible circuits incorporating the same.

BACKGROUND

Electrical circuits are typically formed using discrete electronic packages, such as light emitting diodes (hereinafter LED or LEDs) or other solid state light sources, mounted on a circuit substrate made of a relatively stiff material such as fiber reinforced epoxy (e.g., FR4) or polyimide. The circuit substrate is generally processed to bear conductive traces, conductor pads, and/or other components of a printed circuit on a surface thereof. The electronic packages may be mounted to the conductor pads to thereby couple the electronic packages to the conductive traces and establish the electrical circuit.

SUMMARY

Although such circuits are useful, the use of relatively stiff circuit substrates may impose design limitations. Technology has therefore been developed to produce flexible circuits that are manufactured from flexible substrate materials such as plastic and polyester materials. Flexible circuits allow freedom in design and may be constructed using roll-to-roll manufacturing techniques. In roll-to-roll manufacturing techniques, the flexible circuits may be established by coupling electronic packages to conductive traces on a continuous web of flexible substrate material. Roll-to-roll manufacturing can facilitate efficient mass production of high performance flexible or roll-up electronic devices, such as LED lighting arrays, solar panels, displays, radio-frequency identification (RFID) devices, etc.

Embodiments are configured to facilitate rolling of a flexible substrate on which one or more conductor pads are provided. Roll-to-roll manufacturing may be used to form the conductor pads on the flexible substrate and/or to couple electronic packages to associated ones of the conductor pads to establish a flexible circuit. Although embodiments are described herein in connection with flexible lighting circuits, a conductor pad according to embodiments described herein may be used to construct flexible circuits for use in any type of device including, for example, solar panels, displays such as e-paper, computer or television displays, radio-frequency identification (RFID) devices, etc. A conductor pad according to embodiments described herein includes a conductive material having a perimeter edge with at least first and second convex segments and at least one non-convex segment disposed between the first and second convex segments. This configuration facilitates rolling of the conductor pad and a flexible substrate on which the conductor pad is formed, and also facilitates spreading of heat from electronic devices coupled to the conductor pad.

In an embodiment, there is provided a conductor pad. The conductor pad includes: a first contact region; a second contact region; and a body portion configured to establish a conductive path between the first contact region and the second contact region, the body portion comprising conductive material having a perimeter edge, the perimeter edge including: a first convex segment; a second convex segment; and a first non-convex segment disposed between the first convex segment and the second convex segment.

In a related embodiment, the first non-convex segment may be a concave segment. In another related embodiment, the first contact region and the second contact region may be intersected by a horizontal axis of the conductor pad. In still another related embodiment, the first contact region and the second contact region may be vertically spaced from each other relative to a horizontal axis of the conductor pad. In yet another related embodiment, the first convex segment may have a first convex segment outermost edge at a distance $H_1$ from the horizontal axis, and the second convex segment may define an outermost edge of the perimeter edge at a distance $H_2$ from the horizontal axis, wherein the distance $H_2$ may be greater than the distance $H_1$.

In still yet another related embodiment, the first contact region and the first convex segment may be at a proximal end of the conductor pad and the first convex segment may extend in a direction away from the first contact region at an angle $\theta_1$, wherein $\theta_1$ may be a positive angle. In yet still another related embodiment, the second convex segment may extend upward from the first non-convex segment in a direction away from the horizontal axis at an angle $\theta_2$, wherein $\theta_2$ may be between 0 and 45 degrees, inclusive. In still another related embodiment, the conductor pad may include a third convex segment and a second non-convex segment disposed between the second convex segment and the third convex segment. In a further related embodiment, the second convex segment may define an outermost edge of the perimeter edge at a distance $H_2$ from the horizontal axis, the third convex segment may have a third convex segment outermost edge at a distance $H_3$ from the horizontal axis, and wherein the distance $H_2$ may be greater than the distance $H_3$. In another further related embodiment, the conductor pad may include a fourth convex segment and a third non-convex segment disposed between the third convex segment and the fourth convex segment. In a further related embodiment, the second convex segment may define an outermost edge of the perimeter edge at a distance $H_2$ from the horizontal axis, the fourth convex segment may have a fourth convex segment outermost edge at a distance $H_4$ from the horizontal axis, and wherein the distance $H_2$ may be greater than the distance $H_4$. In another further related embodiment, the fourth convex segment may extend downward toward the second contact region at an angle $\theta_3$, wherein $\theta_3$ may be between 0 and 45 degrees, inclusive.

In yet still another related embodiment, the first contact region and the second contact region may be formed integrally with the body portion.

In another embodiment, there is provided a flexible circuit. The flexible circuit includes: a flexible substrate; a plurality of conductor pads disposed on the flexible substrate, each of the plurality of conductor pads including: a first contact region; a second contact region; and a body portion configured to establish a conductive path between the first contact region and the second contact region, the body portion comprising conductive material having a perimeter edge, the perimeter edge including: a first convex segment; a second convex segment; and a first non-convex segment disposed between the first convex segment and the second convex segment; and a plurality of electronic packages, each of the plurality of electronic packages being coupled to the first contact region of one of the conductor pads and the second contact region of an adjacent one of the contact pads.

In a related embodiment, the first non-convex segment of at least one of the conductor pads in the plurality of conductor pads may be a concave segment. In another related embodiment, the first contact region and the second contact region of at least one of the conductor pads in the plurality of conductor pads may be intersected by a horizontal axis of that conductor pad. In still another related embodiment, the first contact region and the second contact region of at least one of the conductor pads in the plurality of conductor pads may be vertically spaced from each other relative to a horizontal axis of that conductor pad. In yet another related embodiment, the first convex segment of at least one of the conductor pads in the plurality of conductor pads may have a first convex segment outermost edge at a distance $H_1$ from the horizontal axis, the second convex segment of that conductor pad may define an outermost edge of the perimeter edge at a distance $H_2$ from the horizontal axis, and the distance $H_2$ may be greater than the distance $H_1$.

In still yet another related embodiment, the first contact region and the first convex segment of at least one of the conductor pads in the plurality of conductor pads may be at a proximal end of that conductor pad and the first convex segment may extend in a direction away from the first contact region at an angle $\theta_1$, wherein $\theta_1$ may be a positive angle. In yet still another related embodiment, the second convex segment of at least one of the conductor pads in the plurality of conductor pads may extend upward from the first non-convex segment in a direction away from the horizontal axis at an angle $\theta_2$, wherein $\theta_2$ may be between 0 and 45 degrees, inclusive. In still yet another related embodiment, at least one of the conductor pads in the plurality of conductor pads may include a third convex segment and a second non-convex segment disposed between the second convex segment and the third convex segment. In a further related embodiment, the second convex segment may define an outermost edge of the perimeter edge at a distance $H_2$ from the horizontal axis, the third convex segment may have a third convex segment outermost edge at a distance $H_3$ from the horizontal axis, and the distance $H_2$ may be greater than the distance $H_3$. In another further related embodiment, at least one of the conductor pads in the plurality of conductor pads may include a fourth convex segment and a third non-convex segment disposed between the third convex segment and the fourth convex segment. In a further related embodiment, the second convex segment may define an outermost edge of the perimeter edge at a distance $H_2$ from the horizontal axis, the fourth convex segment may have a fourth convex segment outermost edge at a distance a distance $H_4$ from the horizontal axis, and the distance $H_2$ may be greater than the distance $H_4$. In another further related embodiment, the fourth convex segment may extend downward toward the second contact region at an angle $\theta_3$, wherein $\theta_3$ may be between 0 and 45 degrees, inclusive.

In another embodiment, there is provided a method of constructing a flexible circuit to facilitate roll-to-roll manufacturing of the flexible circuit. The method includes: providing a plurality of conductor pads on a flexible substrate, each of the conductor pads including: a first contact region; a second contact region; and a body portion configured to establish a conductive path between the first contact region and the second contact region, the body portion comprising conductive material having a perimeter edge, the perimeter edge including: a first convex segment; a second convex segment; and a first non-convex segment disposed between the first convex segment and the second convex segment; and coupling a plurality of electronic packages to plurality of conductor pads, each of the plurality of electronic packages being coupled to the first contact region of one of the conductor pads and the second contact region of an adjacent one of the contact pads.

BRIEF DESCRIPTION OF THE DRAWINGS

The foregoing and other objects, features and advantages disclosed herein will be apparent from the following description of particular embodiments disclosed herein, as illustrated in the accompanying drawings in which like reference characters refer to the same parts throughout the different views. The drawings are not necessarily to scale, emphasis instead being placed upon illustrating the principles disclosed herein.

DETAILED DESCRIPTION

As used throughout, the term solid state light source(s) refers to one or more light emitting diodes (LEDs), organic light emitting diodes (OLEDs), polymer light emitting diodes (PLEDs), and any other solid state light emitter, including light-emitting electrochemical cells and other materials, and/or combinations thereof, whether connected in series, parallel, and/or combinations thereof.

Figure 1:
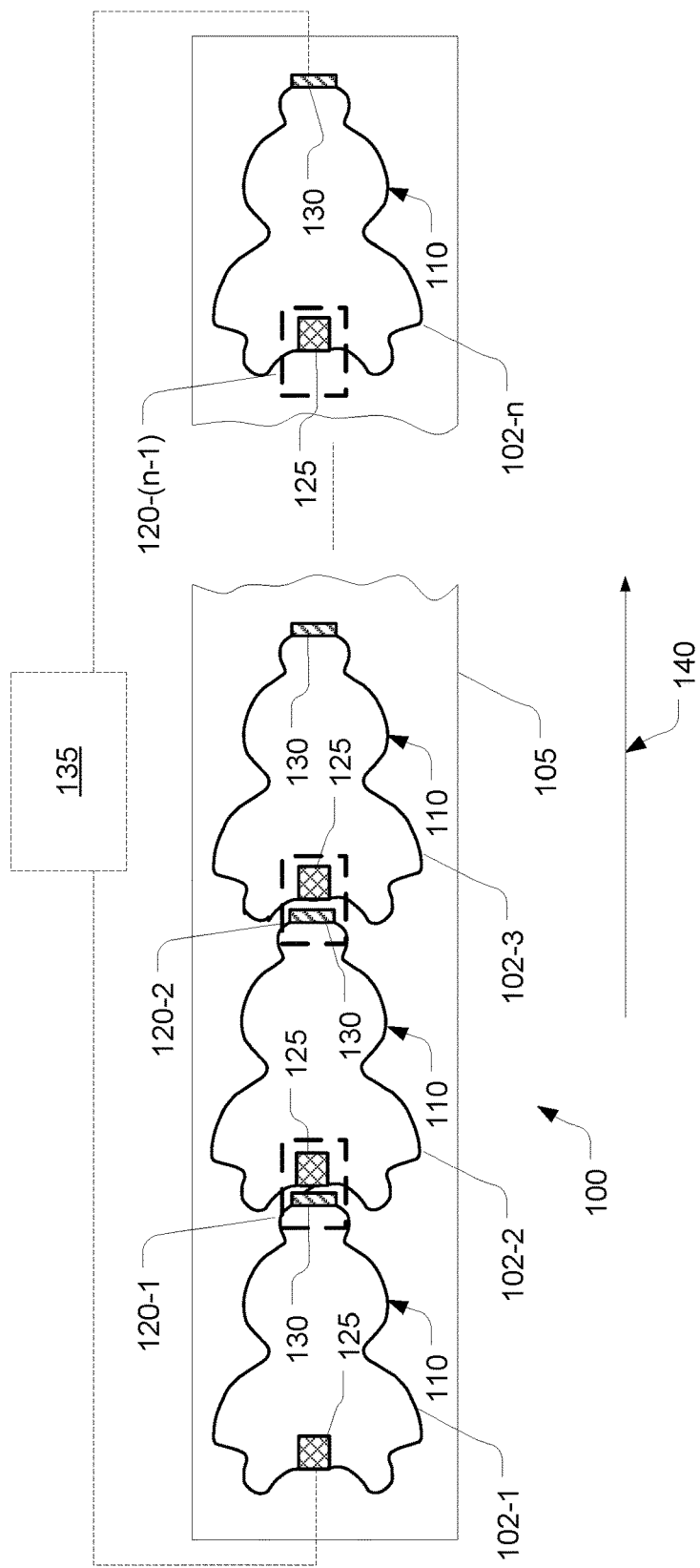
FIG. 1 is diagrammatically illustrates one example of a flexible circuit according to embodiments disclosed herein.

Turning now to FIG. 1, there is illustrated a top view of an exemplary embodiment of a flexible circuit 100 incorporating a plurality of conductor pads 102-1, 102-2, 102-3 . . . 102-*n*. Each of the conductor pads in the plurality of conductor pads 102-1, 102-2, 102-3 . . . 102-*n* includes a body portion 110, a first contact region 125, and a second contact region 130. The body portion 110 establishes a conductive path between the first contact region 125 and the second contact region 130, in each conductor pad. The flexible circuit 100 includes a substrate 105 and a plurality of electronic packages 120-1, 120-2 . . . 120-(n−1). An electronic package in the plurality of electronic packages 120-1, 120-2 . . . 120-(n−1) may, and in some embodiments does, include one or more solid state light sources and/or other electronic components, and is electrically coupled between the first contact region 125 and the second contact region 130 of adjacent ones of conductor pads in the plurality of conductor pads 102-1, 102-2, 102-3 . . . 102-n. The conductor pads 102-1, 102-n at the ends of the substrate 105 may be, and in some embodiments are, coupled to an electrical power source 135. Electrical power supplied to the plurality of electronic packages 120-1, 120-2 . . . 120-(n−1) by the electrical power source 135 may, and in some embodiments does, cause light to emanate from one or more solid state light sources within the plurality of electronic packages 120-1, 120-2 . . . 120-(n−1).

The substrate 105 may be, and in some embodiments is, formed from any material or combination of materials suitable for use as a flexible substrate for an electronic device. In some embodiments, the substrate 105 is in the form of a flexible sheet, a woven and/or non-woven material, a flexible composite, combinations thereof, and the like. The flexible substrate 105 may be, for example, and in some embodiments is, formed from any suitably flexible material, such as but not limited to a polymer, a polymer composite, a polymer fiber composite, a metal, a laminate, or a combination thereof. Non-limiting examples of suitable polymer materials that may be used to form such sheets include shapeable polymers such as polyetheylene (PE), polypropylene (PP), polyethylene terephthalate (PET), polyimide (PI), polyamides, polyethylene napthalate (PEN), polyether ether ketone (PEEK), combinations thereof, and the like.

The body portion 110 of a conductor pad in the plurality of conductor pads 102-1, 102-2, 102-3 . . . 102-n may be, and in some embodiments is, formed of any conductive material with conductivity that is sufficient for electrical applications. A conductor pad in the plurality of conductor pads 102-1, 102-2, 102-3 . . . 102-n is electrically continuous between its first contact region 125 and its second contact region 130 and may be, and in some embodiments is, formed in a continuous unitary shape, or in a shape having discontinuities such as openings therein. For example, the plurality of conductor pads 102-1, 102-2, 102-3 . . . 102-n may be, and in some embodiments are, formed of a metal such as but not limited to copper, silver, gold, aluminum, or the like, including combinations thereof, which may be printed, deposited, and/or plated on a surface of the flexible substrate 105 so as to correspond to a desired pattern. In some embodiments, for example, one or more of the plurality of conductor pads 102-1, 102-2, 102-3 . . . 102-n may be formed on the flexible substrate 105 using a known develop-etch-strip (DES) process.

The first contact region 125 and the second contact region 130 of a conductor pad in the plurality of conductor pads 102-1, 102-2, 102-3 . . . 102-n are formed of an electrically conductive material, and may be, and in some embodiments are, formed integrally with the body portion 110 of that conductor pad, or may be, and in some embodiments are, separately formed and electrically coupled to the body portion 110 of that conductor pad. The first contact region 125 and the second contact region 130 may be formed in any shape or dimension configured for electrically coupling with one or more electronic packages in the plurality of electronic packages 120-1, 120-2 . . . 120-(n−1). When coupled to one or more electronic packages in the plurality of electronic packages 120-1, 120-2 . . . 120-(n−1), the first contact region 125 of a conductor pad in the plurality of conductor pads 102-1, 102-2, 102-3 . . . 102-n may be connected as a cathode and the second contact region 130 of that conductor pad may connected as an anode. Alternatively, the first contact region 125 of a conductor pad in the plurality of conductor pads 102-1, 102-2, 102-3 . . . 102-n may be connected as an anode and the second contact region 130 of that conductor pad may be connected as a cathode.

The plurality of electronic packages 120-1, 120-2 . . . 120-(n−1) may be electrically coupled to the first contact region 125 and the second contact region 130 of adjacent ones of the conductor pads in the plurality of conductor pads 102-1, 102-2, 102-3 . . . 102-n using any suitable means for establishing and/or maintaining an electrical connection between the plurality of electronic packages 120-1, 120-2 . . . 120-(n−1) and the first contact region 125 and the second contact region 130 of adjacent conductor pads in the plurality of conductor pads 102-1, 102-2, 102-3 . . . 102-n. For example, in some embodiments, the plurality of electronic packages 120-1, 120-2 . . . 120-(n−1) are electrically coupled to the first contact region 125 and the second contact region 130 of adjacent conductor pads in the plurality of conductor pads 102-1, 102-2, 102-3 . . . 102-n via an adhesive, wire bonding, die bonding, soldering, combinations thereof, and the like (all not shown).

Advantageously, the shape of the plurality of conductor pads 102-1, 102-2, 102-3 . . . 102-n facilitates rolling of the plurality of conductor pads 102-1, 102-2, 102-3 . . . 102-n and the flexible circuit 100 on which the plurality of conductor pads 102-1, 102-2, 102-3 . . . 102-n in a roll direction indicated by an arrow 140. Rolling of the flexible circuit 100 may, and in some embodiments does, occur during roll-to-roll manufacturing of the flexible circuit 100 and/or during use of the flexible circuit 100. The shape of the plurality of conductor pads 102-1, 102-2, 102-3 . . . 102-n also facilitates spreading of heat from the plurality of electronic packages 120-1, 120-2 . . . 120-(n−1) during operation of the flexible circuit 100.

For ease of explanation, the embodiment 100 illustrated in FIG. 1 includes a single series-connected string of conductor pads 102-1, 102-2, 102-3 . . . 102-n coupled to an elongate flexible substrate 105. It is to be understood, however, that the flexible substrate 105 may be, and in some embodiments is, provided in a variety of shapes and sizes and any number of series and/or parallel connected strings of conductor pads 102-1, 102-2, 102-3 . . . 102-n may be, and in some embodiments are, provided on the flexible substrate 105. Also, the plurality of conductor pads 102-1, 102-2, 102-3 . . . 102-n shown in FIG. 1 have a specific configuration. It is to be understood, that conductor pads 102-1, 102-2, 102-3 . . . 102-n according to embodiments disclosed herein, may be and are provided in a variety of configurations, as described below, and a flexible circuit 100 according to embodiments may be and are formed with any conductor pad configuration consistent with the present disclosure or combinations of different conductor pads consistent with the present disclosure.

Figure 2:
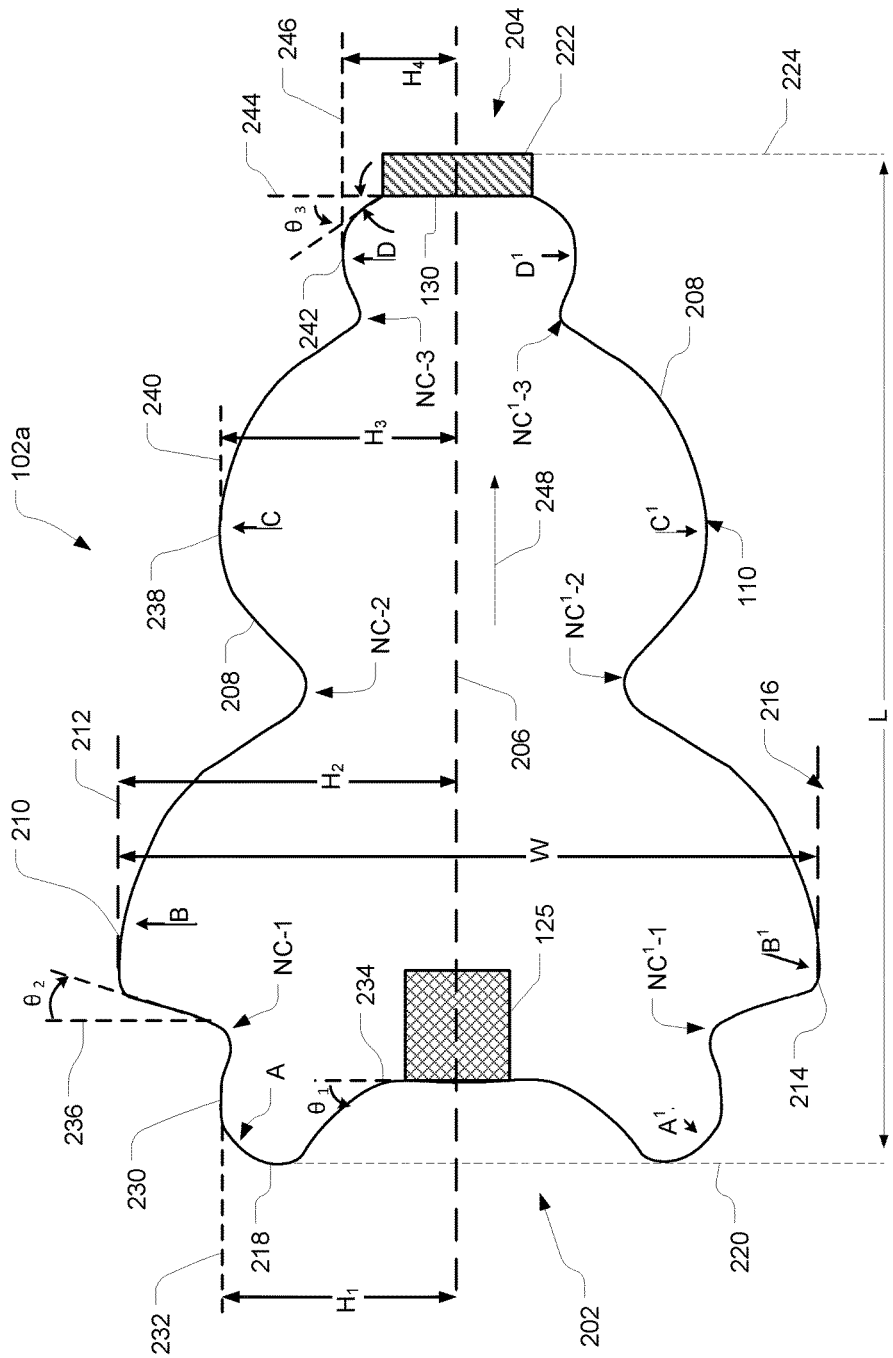
FIG. 2 is a top view of one example of a conductor pad according to embodiments disclosed herein.

FIG. 2 illustrates a conductor pad 102a, which includes a proximal end 202, a distal end 204, and a horizontal axis 206. A perimeter edge 208 of the conductor pad 102a has an outermost side edge 210 that intersects a line 212 parallel to the horizontal axis 206. A lower outermost side edge 214 of the conductor pad 102a intersects a line 216 parallel to the horizontal axis 206. A proximal outermost end edge 218 of the perimeter edge 208 intersects a line 220 perpendicular to the horizontal axis 206, and a distal outermost end edge 222 of the perimeter edge 208 intersects a line 224 perpendicular to the horizontal axis 206. The distance between the outermost side edge 210 and the lower outermost side edge 214 defines a width W of the conductor pad 102a, and the distance between the proximal outermost end edge 218 and the distal outermost end edge 222 defines a length L of the conductor pad 102a. In FIG. 2, the length L is greater than the width W. It is to be understood, however, that a conductor pad consistent with the present disclosure, e.g. the conductor pad 102a, may and in some embodiments does have a length L less than its width W, or may and in some embodiments does have a length L equal to its width W.

A first contact region 125 of the conductor pad 102a is provided at the proximal end 202 and a second contact region 130 of the conductor pad 102a is provided at the distal end 204. The first contact region 125 and the second contact region 130 are intersected by the horizontal axis 206. In FIG. 2, the first contact region 125 and the second contact region 130 form a portion of the perimeter edge 208 at the proximal end 202 and the distal end 204, respectively, and the body portion 110 forms the remainder of the perimeter edge 208. It is to be understood, however, that the first contact region 125 and/or the second contact region 130 may be and in some embodiments are spaced inwardly from the perimeter edge 208, and the perimeter edge may be and in some embodiments is formed entirely by the body portion 110.

With continued reference to FIG. 2, the perimeter edge 208 has a first convex segment A, a second convex segment B, a third convex segment C, and a fourth convex segment D. The convex segments A, B, C, and D of the perimeter edge 208 are separated from each other by one or more non-convex segments NC-1, NC-2, NC-3 of the perimeter edge 208, so that one or more non-convex segments NC-1, NC-2, NC-3 are disposed between any two of the convex segments A, B, C, and D. In the conductor pad 102a, the perimeter edge 208 is symmetrical about the horizontal axis 206 so that the convex segments A, B, C, and D and the non-convex segments NC-1, NC-2, NC-3 have corresponding convex segments $A^1$, $B^1$, $C^1$, and $D^1$, and non-convex segments $NC^1$-1, $NC^1$-2, $NC^1$-3 on an opposite side of the horizontal axis 206.

For ease of explanation, the conductor pad 102a, and other embodiments of conductor pads consistent with the present disclosure, will be described in connection with the convex segments A, B, C, and/or D of the perimeter edge 208 on one side of the horizontal axis 206, e.g. the top side of the conductor pad 102a. It is to be understood, however, that conductor pads consistent with the present disclosure may and in some embodiments do have the same number and configuration of convex segments $A^1$, $B^1$, $C^1$ and/or $D^1$, or a different number and configuration of convex segments $A^1$, $B^1$, $C^1$ and/or $D^1$, formed in the perimeter edge 208 on the opposite side of the horizontal axis 206. Conductor pads consistent with the present disclosure may be and in some embodiments are symmetrical or asymmetrical about the horizontal axis.

As used throughout, the term "convex segment" when used in reference the perimeter edge 208 of a conductor pad refers to a segment of the perimeter edge 208 of the conductor pad that is convex on-average with respect to the conductor pad. The convex segment need not have a continuous arc and may, and in some embodiments does, have one or more undulations, discontinuities, and/or neutral portions as long as the convex segment of the perimeter edge 208 is convex on-average. As used throughout, the term "concave segment" when used in reference to the perimeter edge 208 of a conductor pad refers to a segment of the perimeter edge 208 of the conductor pad that is concave on-average with respect to the conductor pad. The concave segment of the perimeter edge 208 need not have a continuous arc and may, and in some embodiments does, have one or more undulations, discontinuities, and/or neutral portions as long as the concave segment of the perimeter edge 208 is concave on-average with respect to the conductor pad. As used throughout, the term "neutral segment" when used in reference to the perimeter edge 208 of a conductor pad refers to a segment of the perimeter edge 208 that is not convex on-average with respect to the conductor pad or concave on-average with respect to the conductor pad. As used throughout, the term "non-convex segment" when used in reference to the perimeter edge 208 of a conductor pad refers to a segment of the perimeter edge 208 of the conductor pad that is not a convex segment. In embodiments shown throughout, the non-convex segments are illustrated as concave segments. However, a non-convex segment may be, and in some embodiments is, a neutral segment or a concave segment.

In the embodiment 102a illustrated in FIG. 2, the first convex segment A is positioned at the proximal end 202 and extends outward in a direction away from the first contact region 125 at an angle $\theta_1$, then turns upward toward the outermost side edge 210 to define the proximal outermost end edge 218, and then turns inward in the direction of the distal end 204 to define a first convex segment upper outermost edge 230. The first convex segment upper outermost edge 230 intersects a line 232 parallel to the horizontal axis 206 at a distance $H_1$ from the horizontal axis 206. The angle $\theta_1$ is measured from a line 234 perpendicular to the horizontal axis 206 and, in some embodiments, is a positive angle. The outwardly direct shape of the first convex segment A, i.e. outwardly with respect to the first contact region 125, allows the first convex segment A to provide a region of thermal spreading for spreading heat generated by an electronic package, e.g. package 120-1, 120-2 . . . or 120-(n−1) (FIG. 1) coupled to the first contact region 125 and a second contact region 130 of an adjacent conductor pad, e.g. conductor pad 102-1, 102-2, 102-3 . . . 102-n (FIG. 1).

The first non-convex segment NC-1 is disposed between the first convex segment A and the second convex segment B. The first non-convex segment NC-1 extends inward in the direction of the distal end 204 and then upward toward the second convex segment B.

The second convex segment B extends upward from the first non-convex segment NC-1 in a direction away from the horizontal axis 206 at an angle $\theta_2$, then turns in the direction of the distal end 204 to define the outermost side edge 210, and then extends downward away from the outermost side edge 210 toward the horizontal axis 206. The outermost side edge 210, which is defined by the second convex segment B in FIG. 2, intersects the line 212 at a distance $H_2$ from the horizontal axis 206. The angle $\theta_2$ is measured from a line 236 perpendicular to the horizontal axis 206 and, in some embodiments, is a positive angle between zero and/or substantially zero and forty-five and/or substantially forty-five degrees, inclusive. The outwardly directed shape of the second convex segment B, i.e. outwardly with respect to the horizontal axis 206, provides an increasing width of the conductor pad 102a that facilitates thermal spreading and rolling of the conductor pad 102a, e.g. when the conductor pad 102a is coupled to a flexible substrate 105 (FIG. 1).

The second non-convex segment NC-2 is disposed between the second convex segment B and the third convex segment C. The second non-convex segment NC-2 extends downward from the second convex segment B in the direction of the horizontal axis 206 and then upward away from the horizontal axis 206 and toward the third convex segment C.

The third convex segment C extends upward from the second non-convex segment NC-2, away from the horizontal axis 206, then turns in the direction of the distal end 204 to define a third convex segment upper outermost edge 238 and then extends downward away from the third convex segment upper most edge 238 toward the horizontal axis 206. The third convex segment upper outermost edge 238 intersects a line 240 parallel to the horizontal axis 206 at a distance $H_3$ from the horizontal axis 206.

The third non-convex segment NC-3 is disposed between the third convex segment C and the fourth convex segment D. The third non-convex segment NC-3 extends downward from the third convex segment C in the direction of the horizontal axis 206 and then upwardly away from the horizontal axis 206 and toward the fourth convex segment D.

The fourth convex segment D extends upward from the third non-convex segment NC-3, away from the horizontal axis 206, then turns in the direction of the distal end 204 to define a fourth convex segment upper outermost edge 242, and then extends downward away from the fourth convex segment upper outermost edge 242 at an angle $\theta_3$ toward the horizontal axis 206 to intersect the second contact region 130. The fourth convex segment upper outermost edge 242 intersects a line 246 parallel to the horizontal axis 206 at a distance $H_4$ from the horizontal axis. The angle $\theta_3$ is measured from a line 244 perpendicular to the horizontal axis 206 and, in some embodiments, is a positive angle between zero and/or substantially zero and forty-five and/or substantially forty-five degrees, inclusive. The downwardly directed shape of the fourth convex segment D, i.e. downwardly toward the second contact region 130, allows positioning of the fourth convex segment D adjacent a first convex segment A of an adjacent conductor pad with the first convex segment A of the adjacent conductor pad partially encompassing an electronic package, e.g. package 120-1, 120-2 . . . or 120-(n−1) (FIG. 1), coupled between a first contact region 125 and a second contact region 130 of adjacent conductor pads, e.g. conductor pads 102-1, 102-2, 102-3 . . . 102-n (FIG. 1). This facilitates thermal spreading and rolling of the conductor pads, e.g. when the conductor pads are coupled to a flexible substrate 105 (FIG. 1).

In the illustrated conductor pad 102a of FIG. 2, $H_2>H_1$, $H_2>H_3>H_4$, and $H_1$ is substantially equal to $H_3$. Also, the non-convex segments NC-1, NC-2 and NC-3 are configured as concave segments. This configuration facilitates rolling of the conductor pad 102a in a roll direction from the proximal end 202 toward the distal end 204 as indicated by the arrow 248. It is to be understood, however, that a conductor pad consistent with the present disclosure may be provided in a variety of configurations. In the illustrated conductor pad 102a, for example, $H_2$ may be greater than or equal to $H_1$ and $H_3$, and $H_3$ may be greater than or equal to $H_4$. The relative size of $H_1$ to $H_3$ may depend on the desired distance between the first contact region 125 and the second contact region 130 and the desired thermal spreading provided by the first convex segment A. Thus, $H_1$ may be greater or equal to $H_3$, or $H_3$ may be greater than or equal to $H_1$.

A conductor pad consistent with the present disclosure generally facilitates rolling from a wide end of the conductor pad, e.g. the proximal end 202 of the conductor pad 102a, to a narrow end of the conductor pad, e.g. the distal end 204 of the conductor pad 102a. To facilitate thermal spreading, the contact region 125 or 130 generating the most heat may be, and in some embodiments is, positioned at the wide end of the conductor pad. For the conductor pad 102a, for example, the contact region 125 may and in some embodiments does generate more heat than the contact region 130 and is positioned at the proximal end 202 of the conductor pad 120a to facilitate thermal spreading.

Figure 5:
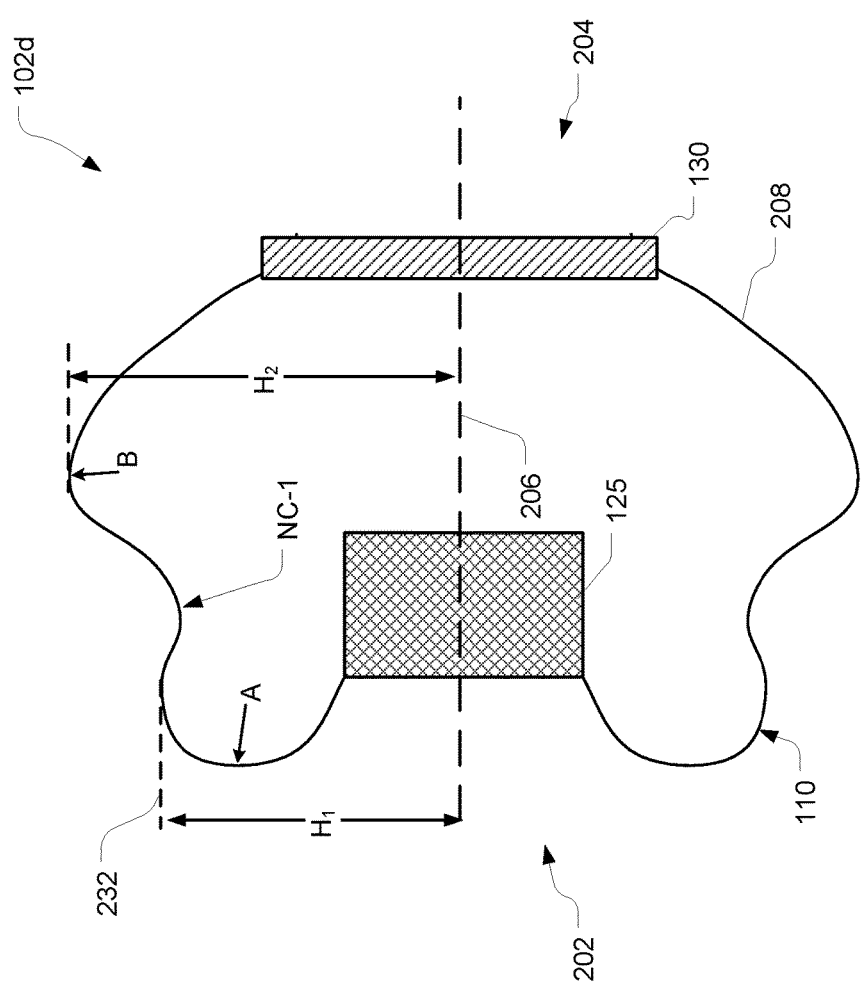
FIG. 5 is a top view of another example of a conductor pad according to embodiments disclosed herein.

A conductor pad consistent with the present disclosure includes at least two (e.g. as shown in FIG. 5) convex segments, e.g. A, B, C, or D, with at least one non-convex segment, e.g. NC-1, NC-2, or NC-3, disposed between the convex segments on each side of the horizontal axis 206, but may be, and in some embodiments is, provided with any number of convex segments. The number of convex segments chosen for a conductor pad consistent with the present disclosure may vary depending upon the desired distance between the first contact region 125 and the second contact region 130 on the conductor pad and the desired rolled diameter of a flexible circuit 105 (FIG. 1) on which the conductor pad is formed. More convex segments separated by non-convex segments in a conductor pad consistent with the present disclosure may facilitate a longer distance between the first contact region 125 and the second contact region 130 of the conductor pad and may allow for rolling to a tighter diameter.

FIGS. 3, 4, 5 and 6 illustrate additional embodiments, 102b, 102c, 102d, and 102e, respectively, of conductor pads consistent with the present disclosure. For ease of explanation, the conductor pads 102b, 102c, 102d, and 102e will be described using the notation used in describing conductor pad 102a illustrated in FIG. 2. In particular, an "A segment" will refer to a convex segment at the proximal end 202 of the conductor pad 102b, 102c, 102d, or 102e and having the characteristics of the first convex segment A in FIG. 2. A "B segment" will refer to a convex segment immediately adjacent an "A segment" with a non-convex segment between the A segment and B segment. The B segment has the characteristics of the second convex segment B in FIG. 2. A "D segment" will refer to a convex segment at the distal end 204 of the conductor pad 102b, 102c, 102d, or 102e, and having the characteristics of the fourth convex segment D in FIG. 2. A "C segment" will refer to a convex segment between a B segment and a D segment. A C segment has the characteristics of the third convex segment C in FIG. 2. Any embodiment of a conductor pad consistent with the present disclosure may include multiple C segments.

Figure 3:
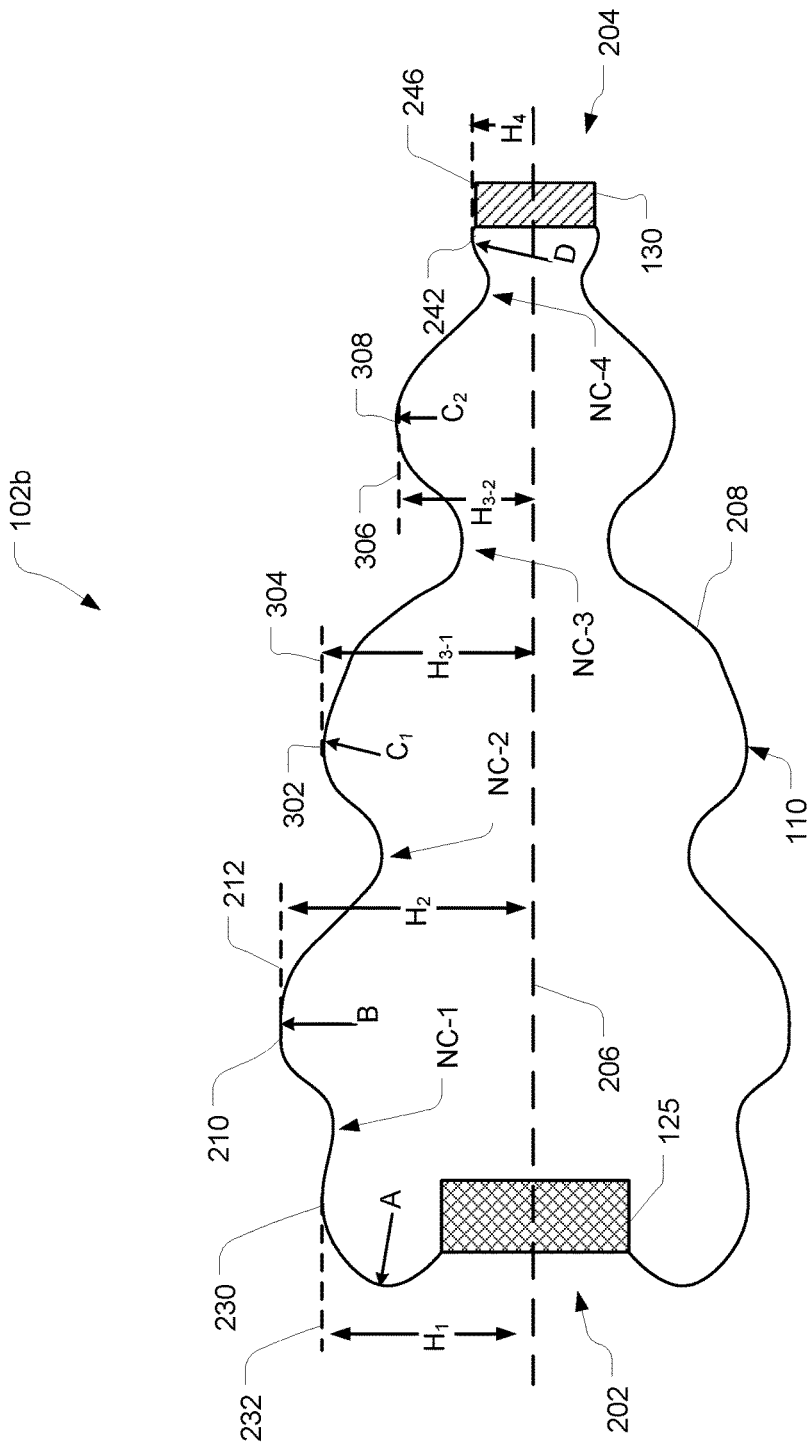
FIG. 3 is a top view of another example of a conductor pad according to embodiments disclosed herein.

The conductor pad 102b illustrated in FIG. 3 includes an A segment, A, a B segment, B, two C segments, $C_1$ and $C_2$, and a D segment. The first C segment $C_1$ has an upper outermost edge 302 that intersects a line 304 parallel to the horizontal axis 206 at a distance $H_{3-1}$ from the horizontal axis 206. The second C segment $C_2$ has an upper outermost edge 306 that intersects a line 308 parallel to the horizontal axis 206 at a distance $H_{3-2}$ from the horizontal axis 206. In the illustrated conductor pad 102b, $H_2>H_1$, $H_2>H_{3-1}$, $H_{3-2}>H_4$, and $H_1$ is substantially equal to $H_{3-1}$.

A first non-convex segment NC-1 is disposed between the A segment, A, and the B segment, B. A second non-convex segment NC-2 is disposed between the B segment, B, and the first C segment, $C_1$. A third non-convex segment NC-3 is disposed between the first C segment, $C_1$, and the second C segment, $C_2$. A fourth non-convex segment NC-4 is disposed between the second C segment, $C_2$, and the D segment, D.

Figure 4:
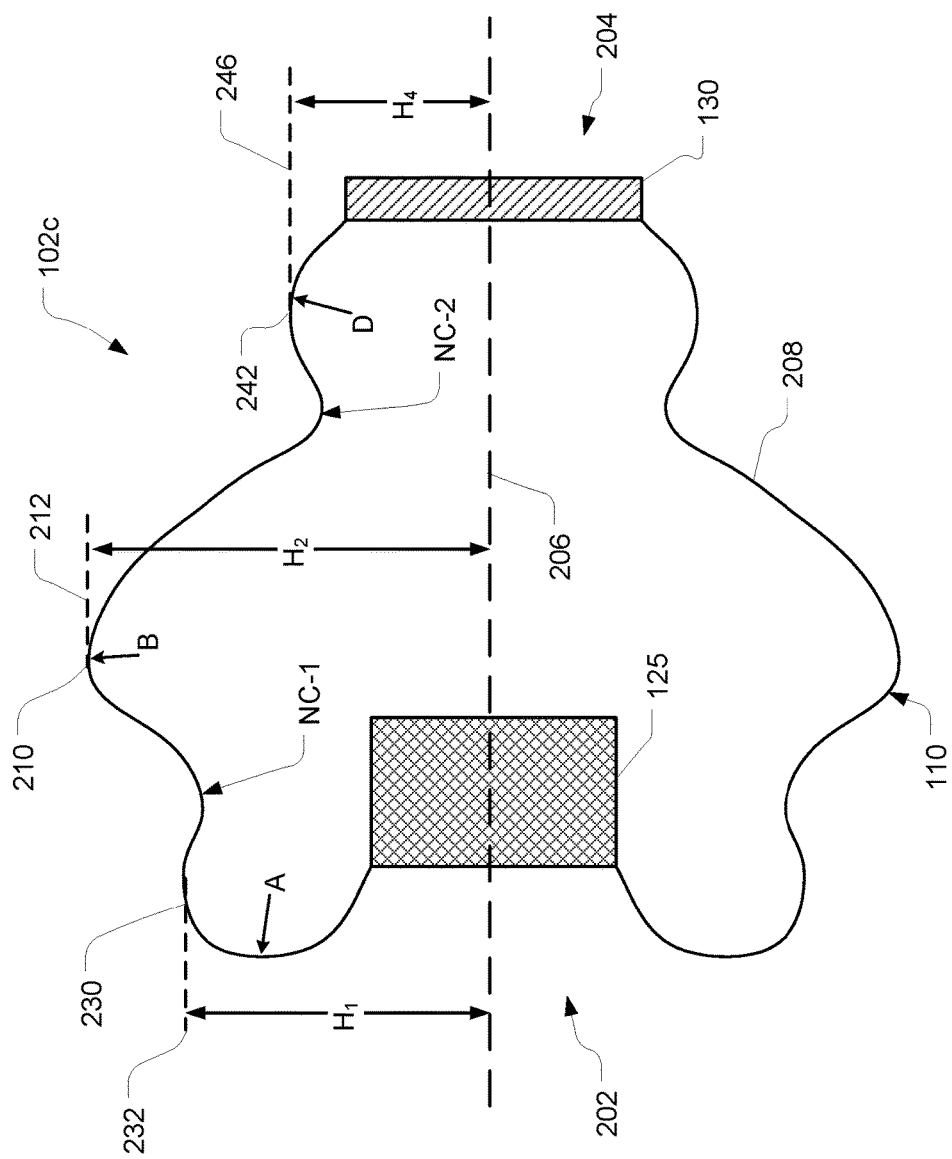
FIG. 4 is a top view of another example of a conductor pad according to embodiments disclosed herein.

The conductor pad 102c illustrated in FIG. 4 includes an A segment, A, a B segment, B, and a D segment, D, i.e. the conductor pad 102c of FIG. 4 does not include a C segment.

A first non-convex segment NC-1 is disposed between the A segment, A, and the B segment, B. A second non-convex segment NC-2 is disposed between the B segment, B, and the D segment. In the illustrated conductor pad 102c, $H_2>H_1>H_4$.

The conductor pad 102d illustrated in FIG. 5 includes only two convex segments, i.e. an A segment, A, and a B segment, B, i.e. the embodiment of FIG. 5 does not include a C segment or a D segment. A first non-convex segment NC-1 is disposed between the A segment, A, and the B segment, B. In the illustrated conductor pad 102d, $H_2>H_1$.

Figure 6:
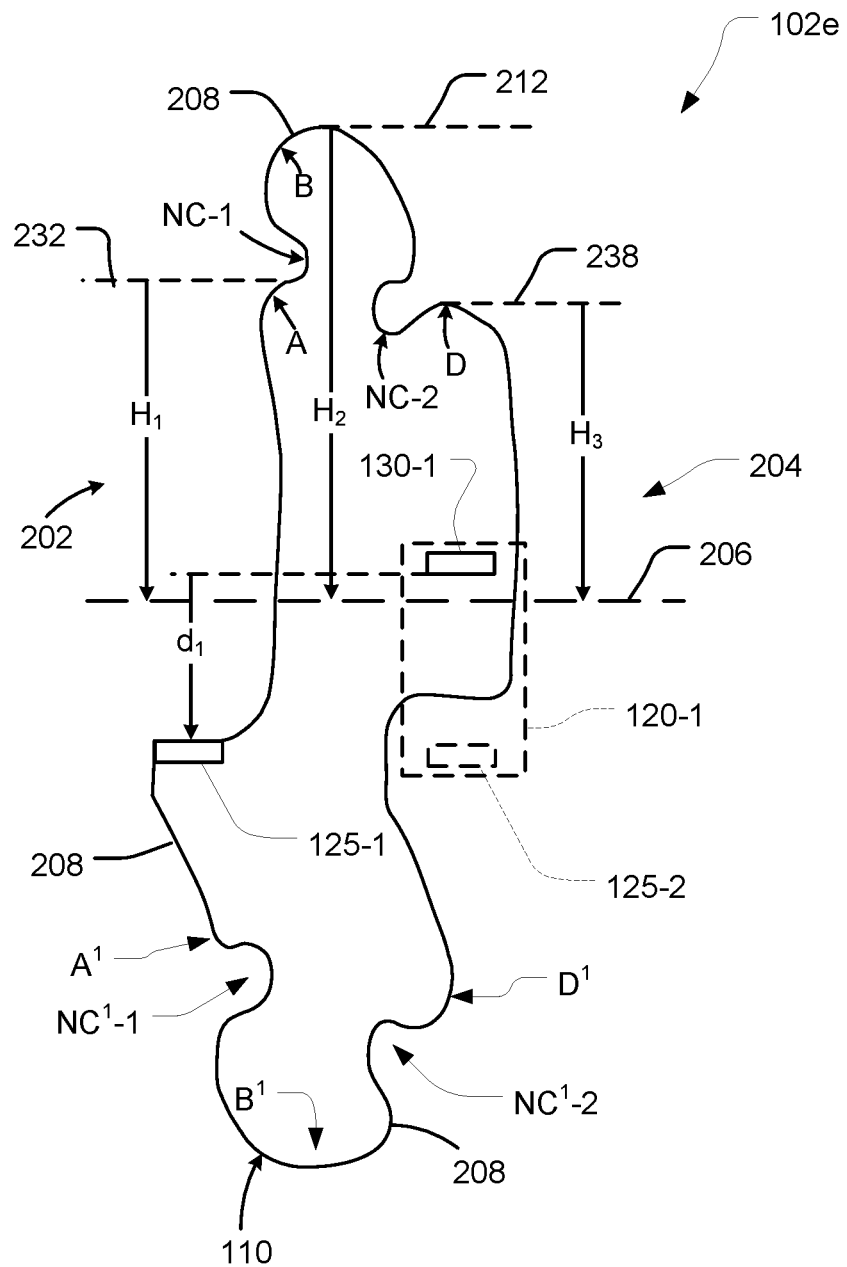
FIG. 6 is a top view of another example of a conductor pad according to embodiments disclosed herein.

The conductor pad 102e illustrated in FIG. 6 is an example of a conductor pad consistent with the present disclosure that is asymmetrical about its horizontal axis 206. The illustrated embodiment 102e includes three convex segments, i.e. an A segment, A, a B segment, B, and a D segment D on a first side of the horizontal axis 206, i.e. the top side in FIG. 6, and three convex segments, i.e. an A segment, $A^1$, a B segment, $B^1$, and a D segment $D^1$ on a second side of the horizontal axis 206. A first non-convex segment NC-1 is disposed between the A segment, A, and the B segment, B, and a second non-convex segment NC-2 is disposed between the B segment, B, and the D segment, D. A first non-convex segment $NC^1$-1 is disposed between the A segment, $A^1$, and the B segment, $B^1$, and a second non-convex segment $NC^1$-2 is disposed between the B segment, $B^1$, and the D segment, $D^1$. In the illustrated conductor pad 102e, $H_2>H_1>H_3$.

The conductor pad 102e includes a first contact region 125-1 and a second contact region 130-1. The first contact region 125-1 and the second contact region 130-1 are vertically spaced from each other relative to the horizontal axis 206 by a distance $d_1$ and do not intersect the horizontal axis 206. With this configuration, electronic packages may be, and in some embodiments are, coupled to vertically spaced contact regions of adjacent conductor pads. As shown in FIG. 6, for example, an electronic package 120-1 may be coupled between the contact region 130-1 on the conductor pad 102e and a contact region 125-2 of an adjacent conductor pad (not shown).

Figure 7:
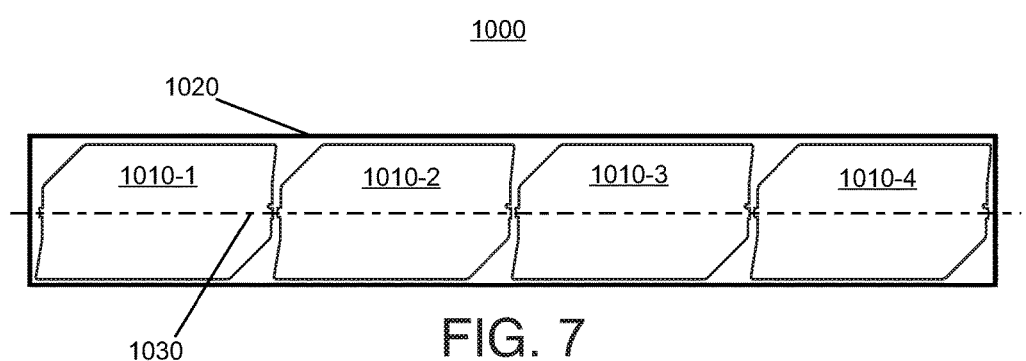
FIG. 7 is top view of an arrangement of conductor pads according to embodiments disclosed herein.

FIG. 7 shows an arrangement 1000 of conductor pads 1010-1, 1010-2, 1010-3, and 1010-4 on a flexible substrate 1020. Though the arrangement 1000 of FIG. 7 includes four conductor pads, embodiments are not so limited, but rather four pads are shown for ease of illustration only, and not limitation. The arrangement 1000 shows the four conductor pads 1010-1, 1010-2, 1010-3, and 1010-4 in a successive row. The conductor pads 1010-1, 1010-2, 1010-3, and 1010-4 have a generally quadrilateral shape in a plane including the conductor pads 1010-1, 1010-2, 1010-3, and 1010-4, with two opposing corners of each pad cut off and the remaining opposing corners slightly bumped out in the direction of each adjacent pad. A central axis 1030 is shown as running through the center of the conductor pads 1010-1, 1010-2, 1010-3, and 1010-4, and each pad has a small protrusion extending from the pad on each side of the pad touched by the central axis 1030, with, in some embodiments, the small protrusion centered on the central axis 1030. In some embodiments, the small protrusion serves as a contact region.

Though the conductor pads 1010-1, 1010-2, 1010-3, and 1010-4 are not similarly shaped to the conductor pads shown and described in regards to FIGS. 1-6, the conductor pads 1010-1, 1010-2, 1010-3, and 1010-4 function similarly in that they enable rolling of the flexible substrate 1020 in the direction of the central axis 1030. The conductor pads 1010-1, 1010-2, 1010-3, and 1010-4 enable rolling without weakening contact between an electrical device (such as one of the electrical packages 120 shown in FIG. 1) and one or more of the conductor pads 1010-1, 1010-2, 1010-3, and 1010-4, and while maintaining good thermal dissipation. The opposing protruding corners and the opposing cut off corners of each of the conductor pads 1010-1, 1010-2, 1010-3, and 1010-4 reduce stress when the flexible substrate 1020 is rolled in the direction of the central axis 1030.

Figure 8:
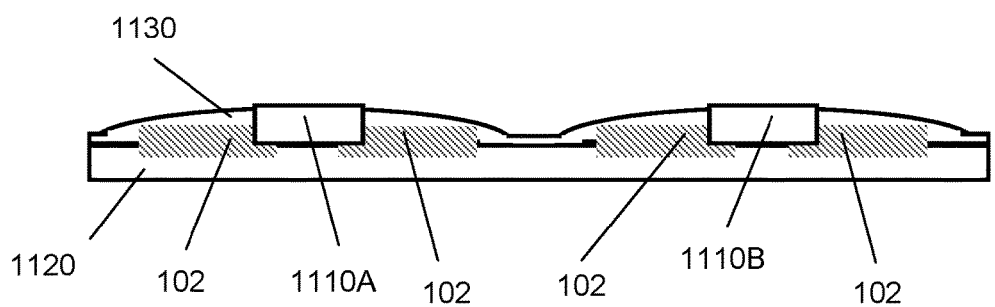
FIG. 8 is a cross-sectional view of a flexible light engine including one or more conductor pads according to embodiments disclosed herein.

In embodiments where one or more of the conductor pads 1010-1, 1010-2, 1010-3, and 1010-4 provide electrical contact for one or more solid state light sources, one further consequence of the shape of the conductor pads 1010-1, 1010-2, 1010-3, and 1010-4, particularly when spread in an array (not shown in FIG. 7), is that the covering material placed on top of the conductor pads 1010-1, 1010-2, 1010-3, and 1010-4 may rise and fall in some locations and/or overall, creating small peaks and/or valleys in the covering material. Such peaks and/or valleys may, and in some embodiments do, help will overall light distribution from the one or more solid state light sources, by providing an angled reflectance for light emitting near and/or substantially near and/or substantially along the outer surface of the covering material. In some embodiments, this is due to the potentially varying thickness of one or more of the conductor pads 1010-1, 1010-2, 1010-3, and 1010-4, and in some embodiments, this occurs without any variation and/or without substantially any variation in the thickness of the conductor pads 1010-1, 1010-2, 1010-3, and 1010-4. Though the shape of the conductor pads 1010-1, 1010-2, 1010-3, and 1010-4 of FIG. 7 are somewhat different from those of the conductor pads shown in FIGS. 1-6, the same principle applies to any of the conductor pads shown in FIGS. 1-6 when covered by some type of covering material, such as but not limited to one or more layers of a laminated polymer, such as but not limited to PET. This effect is illustrated in the cross sectional view of a flexible light engine 1100 shown in FIG. 8. In FIG. 8, the flexible light engine 1100 includes a flexible substrate 1120 comprising one or more conductor pads 102, a coverlay layer 1130, and at least two solid state light sources 1110A and 1110B. The thickness of the conductor pads 102 pushes the coverlay layer 1130 up in some areas, creating peaks, and the absence of the conductor pads 102 in other areas results in the coverlay layer 1130 lying flatter in such areas, creating valleys.

As used in any embodiment herein, a "circuit" or "circuitry" may comprise, for example, singly or in any combination, hardwired circuitry, programmable circuitry, state machine circuitry, and/or firmware that stores instructions executed by programmable circuitry.

Unless otherwise stated, use of the word "substantially" may be construed to include a precise relationship, condition, arrangement, orientation, and/or other characteristic, and deviations thereof as understood by one of ordinary skill in the art, to the extent that such deviations do not materially affect the disclosed methods and systems.

Throughout the entirety of the present disclosure, use of the articles "a" and/or "an" and/or "the" to modify a noun may be understood to be used for convenience and to include one, or more than one, of the modified noun, unless otherwise specifically stated. The terms "comprising", "including" and "having" are intended to be inclusive and mean that there may be additional elements other than the listed elements.

Elements, components, modules, and/or parts thereof that are described and/or otherwise portrayed through the figures to communicate with, be associated with, and/or be based on, something else, may be understood to so communicate, be associated with, and or be based on in a direct and/or indirect manner, unless otherwise stipulated herein.

Spatially relative terms, such as "beneath," "below," "upper," "lower," "above" and the like may be used herein for ease of description to describe one element or feature's relationship to another element(s) or feature(s) as illustrated in the drawings. These spatially relative terms are intended to encompass different orientations of the device in use or operation in addition to the orientation shown in the drawings. For example, if the device in the drawings is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Although the methods and systems have been described relative to a specific embodiment thereof, they are not so limited. Obviously many modifications and variations may become apparent in light of the above teachings. Many additional changes in the details, materials, and arrangement of parts, herein described and illustrated, may be made by those skilled in the art.

What is claimed is:

1. A conductor pad comprising:
    a first contact region;
    a second contact region; and
    a body portion configured to establish a conductive path between the first contact region and the second contact region, the body portion comprising conductive material having a perimeter edge, the perimeter edge comprising:
        a first convex segment;
        a second convex segment;
        a first non-convex segment disposed between the first convex segment and the second convex segment;
        a third convex segment;
        a second non-convex segment disposed between the second convex segment and the third convex segment;
        a fourth convex segment; and
        a third non-convex segment disposed between the third convex segment and the fourth convex segment;
    wherein the second convex segment defines an outermost edge of the perimeter edge at a distance $H_2$ from the horizontal axis, wherein the fourth convex segment has a fourth convex segment outermost edge at a distance $H_4$ from the horizontal axis, and wherein the distance $H_2$ is greater than the distance $H_4$.

2. The conductor pad of claim 1, wherein the first non-convex segment is a concave segment.

3. The conductor pad of claim 1, wherein the first contact region and the second contact region are intersected by a horizontal axis of the conductor pad.

4. The conductor pad of claim 1, wherein the first contact region and the second contact region are vertically spaced from each other relative to a horizontal axis of the conductor pad.

5. The conductor pad of claim 1, wherein the first convex segment has a first convex segment outermost edge at a distance $H_1$ from the horizontal axis, and wherein the second convex segment defines an outermost edge of the perimeter edge at a distance $H_2$ from the horizontal axis, wherein the distance $H_2$ is greater than the distance $H_1$.

6. The conductor pad of claim 1, wherein the first contact region and the first convex segment are at a proximal end of the conductor pad and the first convex segment extends in a direction away from the first contact region at an angle $\theta_1$, wherein $\theta_1$ is a positive angle.

7. The conductor pad of claim 1, wherein the second convex segment extends upward from the first non-convex segment in a direction away from the horizontal axis at an angle $\theta_2$, wherein $\theta_2$ is between 0 and 45 degrees, inclusive.

8. The conductor pad of claim 1, wherein the second convex segment defines an outermost edge of the perimeter edge at a distance $H_2$ from the horizontal axis, wherein the third convex segment has a third convex segment outermost edge at a distance $H_3$ from the horizontal axis, and wherein the distance $H_2$ is greater than the distance $H_3$.

9. The conductor pad of claim 1, wherein the fourth convex segment extends downward toward the second contact region at an angle $\theta_3$, wherein $\theta_3$ is between 0 and 45 degrees, inclusive.

10. The conductor pad of claim 1, wherein the first contact region and the second contact region are formed integrally with the body portion.

* * * * *